United States Patent [19]

Sato

[11] 4,061,980
[45] Dec. 6, 1977

[54] RADIO RECEIVER WITH PLURAL CONVERTERS AND FREQUENCY CONTROL

[75] Inventor: Tsutomu Sato, Tokyo, Japan

[73] Assignee: Sony Corporation, Tokyo, Japan

[21] Appl. No.: 733,528

[22] Filed: Oct. 18, 1976

[30] Foreign Application Priority Data

Oct. 21, 1975  Japan .......................... 50-143113[U]

[51] Int. Cl.² .............................................. H04B 1/26
[52] U.S. Cl. .................................. 325/419; 325/421; 325/433; 325/455
[58] Field of Search .................. 325/17, 346, 419–423, 325/431–433, 453, 455, 457, 460, 464, 465, 468, 25; 331/17, 25

[56] References Cited

U.S. PATENT DOCUMENTS

| | | | |
|---|---|---|---|
| 2,998,517 | 8/1961 | Beckerich | 325/432 |
| 3,758,853 | 9/1973 | Dionne et al. | 325/455 |
| 3,835,384 | 9/1974 | Liff | 325/419 |
| 3,845,394 | 10/1974 | Hamada | 325/455 |
| 3,983,484 | 9/1976 | Hodama | 325/25 |

Primary Examiner—Robert L. Griffin
Assistant Examiner—Jin F. Ng
Attorney, Agent, or Firm—Hill, Gross, Simpson, Van Santen, Steadman, Chiara & Simpson

[57] ABSTRACT

A radio receiver including first and second frequency converters to produce first and second intermediate frequency signals, a local oscillator generating a first local signal to be supplied to the second frequency converter, a variable frequency oscillator, and a circuit arrangement to produce a second local signal to be supplied to the first frequency converter based upon the first local signal and an output signal of the variable frequency oscillator. The radio receiver also includes a display means to display a received broadcasting wave.

3 Claims, 8 Drawing Figures

FREQUENCY OF BROADCAST. SIG.

FREQ. OF VFO(12)

RADIO RECEIVER WITH PLURAL CONVERTERS AND FREQUENCY CONTROL

BACKGROUND OF THE INVENTION

1. Field of the Invention

This invention relates generally to a radio receiver, and more particularly to a novel double superheterodyne receiver having a phase locked loop (PLL).

2. Description of the Prior Art

In general, the prior art radio receiver employs a superheterodyne. As well known, the superheterodyne receiver converts a received modulated carrier signal to a second radio frequency carrier signal whose frequency is lower than that of the received carrier signal. The second radio frequency is called as an intermediate frequency (IF). By converting the carrier of high frequency to that of low frequency, it can be designed to provide much higher and more uniform amplification and selectivity per stage over the entire tuning range of the receiver, and the signal-selection circuits in the IF amplifier are permanently fixed-tuned to the particular frequency employed in it. They can be designed for optimum performance as this frequency. In general, the intermediate frequency (IF) is selected 455 $KH_r$.

Further, in the art there has been proposed an AM radio receiver or special receiver of double superheterodyne type for receiving broadcasting waves of higher frequency in which an incoming signal is not converted to the intermediate frequency signal of 455 $KH_z$ by a mixer directly but the incoming signal is converted to a signal whose frequency is higher than 455 $KH_z$ but lower than that of the incoming signal at the front stage of the mixer.

Such a type of receiver includes first and second separate oscillators, and first and second mixers, respectively. For example, the incoming signal is converted to a signal with the frequency of 45.145 $MH_z$ (first IF signal) by the local signal generated by the first oscillator, and then the first IF signal is converted to a signal with the frequency of 455 $KH_z$ (second If signal) by the local signal generated from the second oscillator. As described just above, in the prior art double superheterodyne receiver the incoming signal is frequency-converted twice to receive broadcasting waves of high frequency stably.

As set forth above, the double superheterodyne receiver generally includes two separate local oscillators, so that it is required that the two oscillators always produce local signals so as to provide first and second IF signals correctly. Especially, when there is a drift in the frequency of the local signal which is generated by the second oscillator and supplied to the second mixer to produce the second IF signal, it can not be possible to produce the second IF signal having a predetermined frequency, for example, 455 $KH_r$. If the above frequency drift exists, the detector provided at the rear stage of the IF stage will produce a distorted audio signal.

Recently, such a receiver has been proposed which comprises a tuner, so called PLL (phase locked loop) using a reference oscillator and a voltage controlled oscillator. The tuner using the PLL can be, of course, adapted to a double superheterodyne receiver. It is, however, expensive to use two PLLs. In addition, when the frequency of a received signal is displayed or a display device by using the signal from the PLL, the error operation of a counter oftenly causes an error frequency display and a flicker in display.

SUMMARY OF THE INVENTION

An object of this invention is to provide an improved radio receiver free from the defects of the prior art.

Another object of the invention is to provide a radio receiver which correctly receives a desired broadcasting wave with a simple circuit construction.

A further object of the invention is to provide a novel radio receiver which includes first and second frequency converters and a circuit producing a local frequency signal to be supplied to the first frequency converter based upon a local frequency signal supplied to the second frequency converter.

A still further object of the invention is to provide a radio receiver of a double superheterodyne type having first and second frequency converters in which even if there is a frequency drift in a local signal supplied to the second frequency converter, a second IF signal always has a predetermined frequency and hence an audio signal with no distortion can be reproduced.

A further object of the invention is to provide a radio receiver of a double superheterodyne type which has provided with a circuit obtaining a beat between a local frequency signal fed to a second frequency converter and a frequency signal from a variable frequency oscillator, a circuit comparing the phase of a frequency signal from the beat circuit with that of a frequency signal from a reference oscillator, a circuit controlling a voltage controlled oscillator with a signal from the comparing circuit, and a circuit supplying a signal from the voltage controlled oscillator to a first frequency converter to always achieve a stable signal reception.

A further object of the invention is to provide a radio receiver which has a display device so as to display the frequency of a received broadcasting wave thereon correctly.

A yet another object of the invention is to provide a radio receiver having a frequency display device free from flicker in display.

The other objects, features and advantages of the invention will be apparent from the following description taken in conjunction with the accompanying drawings.

DESCRIPTION OF THE PREFERRED EMBODIMENT

The radio receiver according to the present invention will be hereinbelow described with reference to the drawings.

Figure 1:
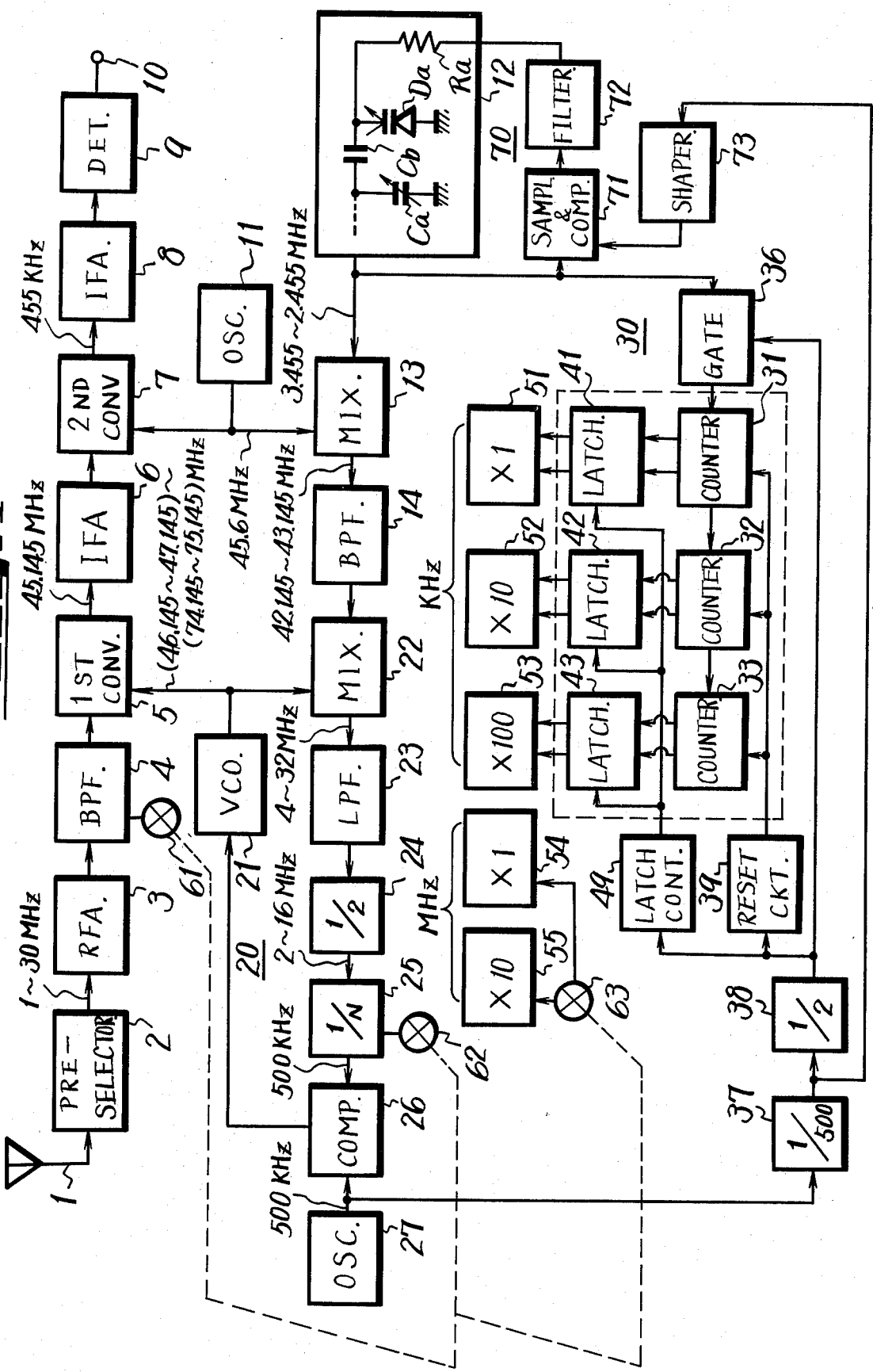
FIG. 1 is a block diagram showing an embodiment of the radio receiver according to the present invention.

FIG. 1 shows an embodiment of the radio receiver according to the invention in which the frequency band of a signal to be received is 1~30 MH$_z$, this band is divided into 29 bands each having the band of 1 MH$_z$, and at every band a signal of a desired frequency within it can be received.

In FIG. 1, 1 designates an antenna to which a pre-selector 2 is connected. The pre-selector 2 selects a received signal of 1~30 MH$_z$ and supplies the same through a radio frequency amplifier 3 to a variable band pass filter 4. If a band-change switch 61 connected to the band pass filter 4 is changed over, a received signal of desired frequency band can be derived from the band pass filter 4. The received signal from the band pass filter 4 is fed to a first frequency converter 5 which is also supplied with an oscillation signal from a first local oscillator or VCO (voltage controlled variable frequency oscillator) 21, which will be described later, as a first local oscillation signal. Thus, the carrier of the signal of a desired frequency in the received signals from the band pass filter 4 is frequency-converted to a first IF (intermediate frequency) signal of, for example, 45.145 MH$_z$ by the first frequency converter 5. This first IF signal is supplied through a first IF amplifier 6 to a second frequency converter 7 which is also supplied with a second local oscillation signal, whose oscillation frequency is 45.6 MH$_z$, from a second local oscillator 11 using a quartz oscillating element. Thus, the first IF signal is frequency-converted to a second IF signal, the frequency of whose carrier is 455 KH$_z$, by the second frequency converter 7. The second IF signal is fed through a second IF amplifier 8 to a detector 9 which delivers its detected output signal to an output terminal 10.

The first local oscillation signal is produced by the second local oscillator 11, a VFO (variable frequency oscillator) 12 and a PLL (phase locked loop) 20 in a manner described as follows. The VFO 12 includes a variable capacitor $C_a$ forming its resonance circuit. When the dial (not shown) connected to the capacitor $C_a$ is operated, the VFO 12 produces an oscillation signal whose frequency is varied in the range between 3.455 and 2.455 MH$_z$ in response to the dial operation. This oscillation signal is fed to a mixer 13 which is also supplied with the second local oscillation signal from the second local oscillator 11. Thus, the mixer 13 produces a beat signal whose frequency is varied in the range between 42.145 and 43.145 MH$_z$. This beat signal is supplied through a band pass filter 14 to a mixer 22 which is supplied with the oscillation signal from the VCO 21. Thus, the mixer 22 produces a beat signal whose frequency corresponds to the frequency difference between two signals applied thereto. This beat signal is fed through a low pass filter 23 to a frequency divider 24 of ½ and then frequency-divided by ½. The frequency-divided signal is then fed to a variable frequency divider 25 of 1/N and then frequency-divided by 1/N. In this case, the frequency dividing ratio 1/N of frequency divider 25 is changed from ¼ to 1/32 (N = 4 to 32) by changing over a band change switch 62 which is ganged with the switch 61. A phase comparator 26 is supplied with the frequency-divided signal from the frequency divider 25 and with an oscillation signal with the frequency of 500 KH$_z$ from a fixed oscillator 27 using a quartz oscillating element. The frequency-divided signal from the frequency divider 25 and the oscillation signal from the oscillator 27 are phase-compared in the comparator 26 which supplies its output signal to the VCO 21 as a control signal.

As a display device of the frequency of a received signal there is provided a counter device 30 of a down-count type. In FIG. 1, 31 to 33 designate decimal counters which are connected in series so as to count down input pulses thereto. The oscillation signal from the VFO 12 is fed to a gate circuit 36 as its gate input. The oscillation signal from the oscillator 27 is supplied to a frequency divider 37 of 1/500, then frequency-divided by 1/500, supplied to a frequency divider 38 of ½, then frequency-divided by ½ and fed to the gate circuit 36 as its control signal or time base signal. Thus, during a time interval within which the frequency divided signal from the frequency divider 38 is rising up (1 millisecond), the oscillation signal from the VFO 12 passes through the gate circuit 36 and then is fed to the counters 31 to 33 sequentially. In the counters 31 to 33, the sections of 1, 10 and 100 KH$_z$ of the received frequency are counted down, respectively. The counted contents of counters 31 to 33 are fed through latch circuits 41 to 43 to digital display elements 51 to 53, respectively. Thus, the sections of 1, 10 and 100 KH$_z$ of the received frequency are, respectively, displayed digitally thereon.

At this time, the frequency-divided signal from the frequency divider 38 is fed to a latch control circuit 49 which then produces a latch control signal and supplies the same to the latch circuits 41 to 43, respectively. Digital display elements 54 and 55, which digitally display the sections 1 and 10 MH$_z$ of the received frequency, are changed over by a band changing switch 63, which is ganged with the switches 61 and 62, to be supplied with a driving voltage to display the section, MH$_z$, of the received frequency.

A reset circuit 39 is supplied with the frequency-divided signal from the frequency divider 38 which then produces a reset signal and supplies the same to the counters 31 to 33, respectively. Thus, the counters 31 to 33 are reset before they start their counting the gated output signal from the gate circuit 36. In this case, however, the counters 31 to 33 are so constructed that the counters 31 and 32 are reset by the reset signal at "5" of their contents and the counter 33 is reset at "4" of its content, respectively.

Further, in order to correctly display the lowest section, 1 KH$_z$, of the received frequency on the display element 51, an AFC (automatic frequency control) circuit 70 is provided. That is, for example, a variable capacitance diode $D_a$ is connected through a by-pass capacitor $C_b$ in parallel to the variable capacitor $C_a$ forming the VFO 12, and a sampling phase comparator circuit 71 is also provided. The oscillation signal from the VFO 12 is fed to the phase comparator circuit 71 as its input. This phase comparator circuit 71 is also supplied with the frequency-divided signal from the frequency divider 37 through a sampling pulse generator circuit 73 as a sufficiently narrow width sampling pulse (reference pulse) in synchronism with the frequency-divided signal at the same frequency. The output signal from the comparator circuit 71 is fed to a filter 72 and made as a DC voltage which is applied through a buffer resistor $R_a$ to the variable capacitance diode $D_a$ as its control voltage.

Under the stationary state of the radio receiver described above, the frequency of the frequency-divided signal from the frequency divider 25 is selected equal to 500 KH$_z$ which is the oscillation frequency of the oscillator 27, so that when the dividing ratio 1/N of the frequency divider 25 is, for example, ¼ (N = 4), the frequency of the frequency-divided signal from the frequency divider 24 is 2 $MH_z$ and the frequency of the beat signal from the mixer circuit 22 is 4 $MH_z$, respectively. In this case, the oscillation frequency of VCO 21 is the sum of the frequency of beat signal from the band pass filter 14 and that of the beat signal from the mixer 22. The frequency of the beat signal from the filter 14 is varied in response to the dial operation of VFO 12 between 42.145 and 43.145 $MH_z$.

As a result, in case of 1/N = ¼, the VCO 21 produces the oscillation signal whose oscillation frequency is varied between 46.145 and 47.145 $MH_z$ in response to the dial operation of VFO 12.

While, in case of 1/N = 1/32 (N = 32), since the frequency of the beat signal from the mixer 22 is 32 $MH_z$, the VCO 21 produces the oscillation signal whose oscillation frequency is varied between 74.145 and 75.145 $MH_z$ in response to the dial operation of VFO 12.

That is, the frequency of the beat signal from the mixer 22 becomes N $MH_z$, so that the VCO 21 produces the oscillation signal whose oscillation frequency is varied between (42.145 + N) and (43.145 + N) $MH_z$ in response to the dial operation of VFO 12.

The oscillation signal from VCO 21 is fed to the first mixer 5 as the first local oscillation signal and the frequency of the first IF signal is set 45.145 $MH_z$, so that the receiving frequency band is made 1~30 $MH_z$. In this case, by changing the dividing ratio 1/N of the frequency divider 25, the receiving band can be changed at the unit of 1 $MH_z$, and by changing the oscillation frequency of VFO 12, a desired frequency within the respective receiving bands can be received.

In this case, if the oscillation frequency of second oscillator 11 is drifted or deviated by, for example, $+\Delta f$, the frequency of the beat signal from mixer 13 is changed also by $+\Delta f$ and the oscillation frequency of VCO 21 is changed by $+\Delta f$. Therefore, the carrier frequency of the first IF signal from the first frequency converter 5 is changed by $+\Delta f$, so that the carrier frequency of first IF signal and the oscillation frequency of second local oscillation signal supplied to second frequency converter 7 are changed in the same direction and by the same amount. As a result, the carrier frequency of second IF signal from the second frequency converter 7 is not changed. Therefore, even if a drift or deviation presents in the second local oscillation frequency, it causes no drift or deviation in the received frequency.

Figure 2:
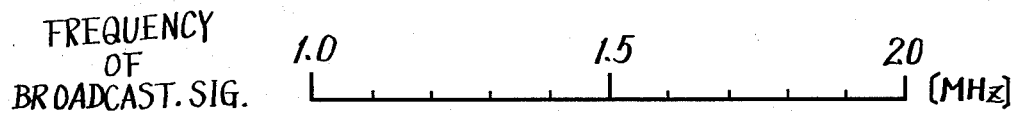
FIGS. 2A and 2B are numeral graphs showing the relation between the frequency of a received broadcasting wave and the frequency of a variable frequency oscillator.
Figure 2:
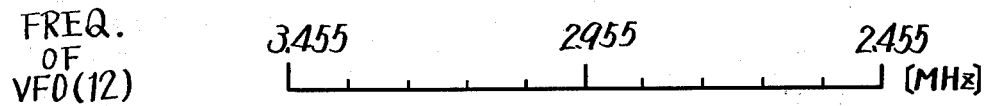

The received frequency is displayed in the following manner. That is, when the dividing ratio 1/N of the frequency divider 25 is selected, for example, ¼, the relation of the received frequency to the oscillation frequency of VFO 12 becomes as shown in FIGS. 2A and 2B. As may be apparent from FIGS. 2A and 2B, as the frequency of the received broadcasting wave becomes high, the oscillation frequency of VFO 12 is lowered.

Figure 3:
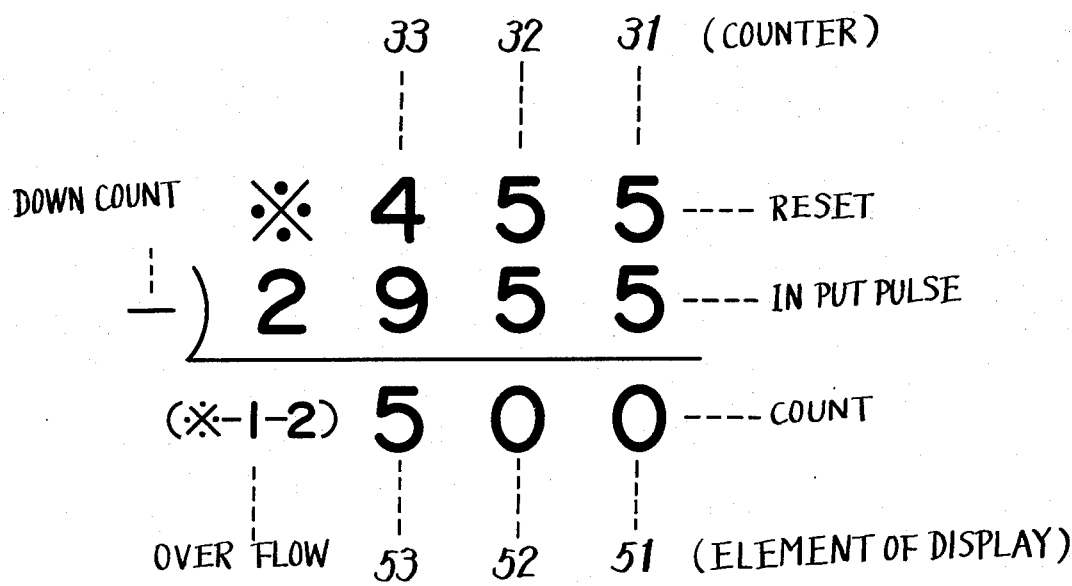
FIG. 3 is a numeral table showing an example of the counting results of a counter used in the invention.

When the oscillation frequency of VFO 12 is set, for example, 2.955 $MH_z$ under such a state, the received frequency is 1.5 $MH_z$ as shown in FIGS. 2A and 2B. In this case, since the gate interval of gate circuit 36 is selected as 1 milli second, the pulse whose cycle is 2.955 × 10⁶ × 1 × 10⁻³ = 2955 is supplied to the counters 31 to 33 at every one gate interval and then counted down. At this time, since the counters 31 to 33 are reset at "5", "5" and "4" as described above, the contents of counters 31 to 33 are changed as shown in FIG. 3. That is, the contents of counters 31 to 33 are descreased by "1" at every input pulse. However, the contents of counters 31 to 34 are decreased from the reset condition "455" and then the contents are decreased to "000", so that when the counters 31 to 33 count the next input pulse, their contents become "999". Thereafter, the contents are decreased from "999" at every input pulse. Accordingly, the down-count in the counters 33 to 31 is not the following equation $$455 - 2955 = -2500$$

but becomes the subtraction shown in FIG. 3 where the mark ·✗· represents an integer greater than 3. At this time, the highest figure ( ✗ − 1 − 2) of the counted result is a figure higher than the counter 33, so that the highest figure overflows and hence "500" which is the counted result of the second to the last figures is displayed on the counters 33 to 31.

Since the above contents of the counters 33 to 31 are transferred to the display elements 53 to 51, "500" which is the sections, $KH_z$, of the received frequency 1.5 $MH_z$ is displayed on the display elements 53 to 51. At this time, the display element 55 is extinguished by the band change-over switch 63 and "1" is displayed on the display element 54. Thus, the received frequency "1.500" is displayed by the display elements 54 to 51. The above operation is carried out for the other bands and received frequencies, similarly.

Figure 4A:
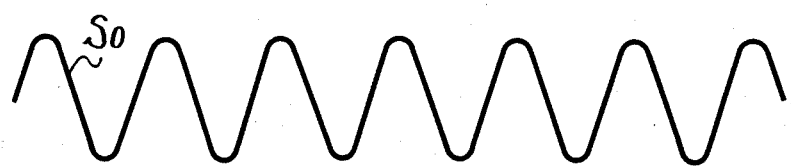
FIGS. 4A and 4B are graphs showing the relation between the output waveform from the variable frequency oscillator and a sampling signal.
Figure 4B:
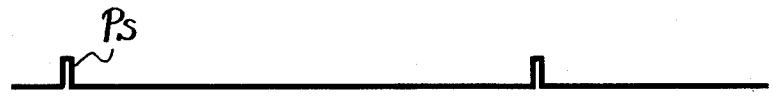

With the present invention, the oscillation signal from the VFO 12 is sampled and phase-comparated in the sampling and phase comparator 71 with the sampling pulse from the shaper circuit 73. Since the frequency of the oscillation signal $S_o$ (refer to FIG. 4A ) from VFO 12 is 3.455~2.455 $Mh_z$ and the frequency of the sampling pulse $P_s$ (refer to FIG. 4B) from the waveform shaper circuit 73 is 1 $KH_z$ which is same as that of the frequency-divided signal from the frequency divider 37, every 3455~2455 cycle of oscillation signal $S_o$ is sampled and phase-compared. In this case, even if the sampling and phasecomparing is carried out for any one cycle of the oscillation signal $S_o$, the level of the DC voltage from the filter 72 is varied similarly in response to the phase difference between the oscillation signal $S_o$ and $P_s$ and the frequency of pulse $P_s$ is 1 $KH_z$. Accordingly, if the capacity of variable capacitor $C_a$ is changed and hence the frequency of oscillation signal $S_o$ is changed by the dial operation, the DC voltage from filter 72 is changed repeatedly in response to the capacity variation of variable capacitor $C_a$ as shown in FIG. 5A.

However, in the case where the capacity of variable capacitor $C_a$ is changed slightly, since the DC voltage from the filter 72 is fed to the variable capacitance diode $D_a$ and the DC voltage is changed as the oscillation frequency is changed, the capacity of variable capacitance diode $DL_a$ is changed reverse to the capacity variation of variable capacitor $C_a$ and hence the latter capacity variation is cancelled with the former capacity variation. As a result, when the capacity of variable capacitor $C_a$ is changed slightly, the frequency of oscillation signal $S_o$ is not changed.

Figure 5A:
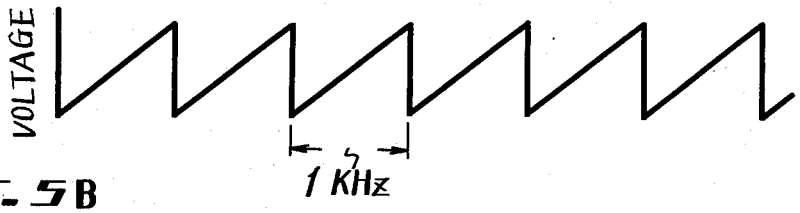
FIGS. 5A and 5B are graphs showing the relation among the capacity variation of a variable capacitor, a voltage and the oscillation frequency.

However, when the capacity of variable capacitor $C_a$ is changed greatly such as corresponds to 1 $KH_z$ of oscillation signal $S_o$, the DC voltage from the filter 72 is changed similarly at every 1 $KH_z$ as shown in FIG. 5A. Therefore, in such a case, the oscillation frequency is changed in step manner to the frequency deviated from the former by 1 KH$_z$. Then, the oscillation frequency is locked at the frequency and is not changed even through the capacity of variable capacitor is changed slightly.

Figure 5B:
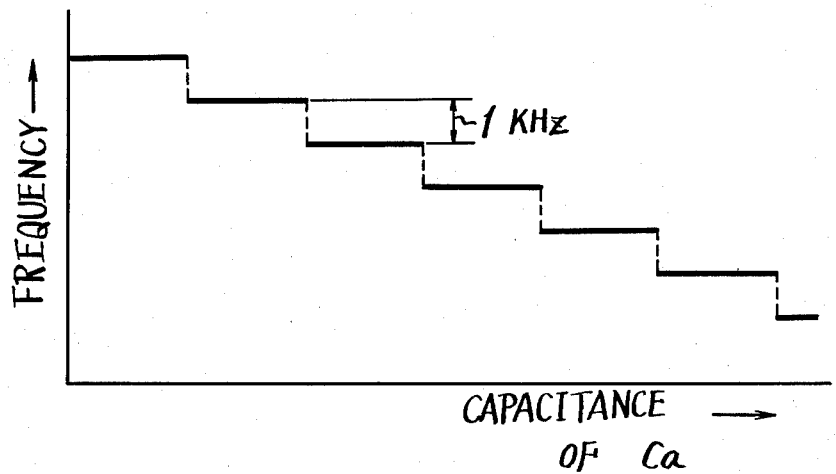

Accordingly, the oscillation frequency of VFO 12 is changed in step manner at every 1 KH$_z$ for the capacity variation of variable capacitor C$_a$ as shown in FIG. 5B and is a multiple of integer for the sampling frequency 1 KH$_z$. That is, since the AFC circuit 70 is provided for VFO 12, the oscillation frequency of VFO 12 is locked at the integer-multiple of 1 KH$_z$ even when the capacity of variable capacitor C$_a$ is change slight. However, when the capacity of the variable capacitor C$_a$ is changed greatly, the oscillation frequency of VFO 12 is released from its lock range and jumped to the next lock range and locked at the frequency apart from the former by 1 KH$_z$.

Accordingly, when the capacity of variable capacitor C$_a$ is changed to change the receiving frequency, the receiving frequency is changed in step manner at every 1 KH$_z$.

In this case, with the present invention the oscillation signal from the VFO 12 is counted by the counter device 30 to display the received frequency and at this time the frequency-divided signal from the frequency divider 37, which is the time base signal of the counter device 30, is used to lock the oscillation frequency of VFO 12. Therefore, a flicker inherent to the received frequency display of the prior art display device is avoided, and also a count error of ± 1 count in the display of the lowest figure 1 KH$_z$ is avoided.

Further, the oscillation signal from the oscillator 27 is frequency-divided by the frequency divider 37 and then is used to lock the oscillation frequency of VFO 12, so that the oscillation frequency thereof becomes very stable.

With the invention when the capacity of the variable capacitor C$_a$ is changed, that is, the dial is operated to change the receiving frequency, the receiving frequency is locked at every 1 KH$_z$ even if the dial operation is deviated small. Therefore, the reception of broadcasting waves can be carried out positively with good feeling. Further, when the sampling pulse is formed, the step of the receiving frequency can be selected at a desired one by changing the frequency dividing ratio and hence changing the sampling frequency. In addition, by cutting off the DC voltage fed from the filter 72 to the diode D$_a$, the lock of oscillation of VFO 12 can be released arbitrarily.

In stead of using the variable capacitor C$_a$, it is possible that a DC voltage, whose level is varied by dial operation, is fed to the diode D$_a$ in superimposed on the DC voltage from the filter 72.

The above description is given on a preferred embodiment of the present invention, but it may be apparent that many modifications and variations could be effected by one skilled in the art without departing from the spirits or scope of the novel concepts of the invention. Therefore, the scope of the invention should be determined by the appended claims only.

I claim as my invention:
1. A radio receiver comprising:
   a. first and second frequency converters for producing first and second intermediate frequency signals;
   b. a first oscillator for generating a first local signal to be supplied to said second frequency converter;
   c. a variable frequency oscillator,
   d. a first mixer for producing a beat signal between said first local signal and an output signal generated by said variable frequency oscillator;
   e. a variable frequency divider for producing a signal having a predetermined frequency based on said beat signal;
   f. a second oscillator for generating a reference signal having the frequency same as that of the signal produced by said variable frequency divider;
   g. a comparison circuit for comparing the phase of said reference signal with that of said signal produced by said variable frequency divider and for producing a control signal;
   h. a voltage controlled oscillator for generating a second local signal to be supplied to said first frequency converter in response to said control signal; and
   i. a second mixer which is supplied with the second local signal and beat signal and produces a beat signal between both the signals, said last beat signal produced by said second mixer being supplied to said variable frequency divider.

2. A radio receiver according to claim 1 further comprising means for displaying a frequency of a received broadcasting wave based on the output signal from said variable frequency oscillator.

3. A radio receiver according to claim 1 further comprising a counter circuit for counting the output signal from said variable frequency oscillator, display means for digitally displaying a received frequency by the output from said counter circuit, a circuit for producing a sampling signal in synchronism with a time base signal for said counter circuit, a sampling circuit for sampling the output from said variable frequency oscillator with said sampling signal, and means for making the output from said variable frequency oscillator have an integer multiple frequency of that of said sampling signal based on the output from said sampling circuit.

* * * * *